(12) United States Patent
Chen et al.

(10) Patent No.: US 7,968,910 B2
(45) Date of Patent: Jun. 28, 2011

(54) COMPLEMENTARY FIELD EFFECT TRANSISTORS HAVING EMBEDDED SILICON SOURCE AND DRAIN REGIONS

(75) Inventors: Xiangdong Chen, Poughquag, NY (US); Thomas W. Dyer, Pleasant Valley, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 505 days.

(21) Appl. No.: 12/103,301

(22) Filed: Apr. 15, 2008

(65) Prior Publication Data
US 2009/0256173 A1 Oct. 15, 2009

(51) Int. Cl.
*H01L 21/02* (2006.01)
*H01L 27/12* (2006.01)
(52) U.S. Cl. .. 257/190; 257/351; 257/371; 257/E27.064
(58) Field of Classification Search .................. 257/190, 257/351, 371, E27.064
See application file for complete search history.

(56) References Cited

U.S. PATENT DOCUMENTS

| | | | |
|---|---|---|---|
| 6,943,407 B2 | 9/2005 | Ouyang et al. | |
| 7,037,770 B2 * | 5/2006 | Chidambarrao et al. | 438/154 |
| 7,170,110 B2 | 1/2007 | Inoue et al. | |
| 7,205,586 B2 | 4/2007 | Takagi et al. | |
| 7,247,534 B2 * | 7/2007 | Chidambarrao et al. | 438/223 |
| 7,495,291 B2 * | 2/2009 | Chidambarrao et al. | 257/371 |
| 2004/0142579 A1 | 7/2004 | Morita et al. | |
| 2005/0239241 A1 | 10/2005 | Ouyang et al. | |
| 2006/0081928 A1 | 4/2006 | Ko et al. | |
| 2006/0145264 A1 | 7/2006 | Chidambarrao et al. | |
| 2007/0020864 A1 | 1/2007 | Chong et al. | |
| 2007/0131969 A1 | 6/2007 | Sanuki et al. | |

* cited by examiner

*Primary Examiner* — Angel Roman
(74) *Attorney, Agent, or Firm* — Ian D. MacKinnon

(57) ABSTRACT

A method is provided of fabricating complementary stressed semiconductor devices, e.g., an NFET having a tensile stressed channel and a PFET having a compressive stressed channel. In such method, a first semiconductor region having a lattice constant larger than silicon can be epitaxially grown on an underlying semiconductor region of a substrate. The first semiconductor region can be grown laterally adjacent to a second semiconductor region which has a lattice constant smaller than that of silicon. Layers consisting essentially of silicon can be grown epitaxially onto exposed major surfaces of the first and second semiconductor regions after which gates can be formed which overlie the epitaxially grown silicon layers. Portions of the first and second semiconductor regions adjacent to the gates can be removed to form recesses. Regions consisting essentially of silicon can be grown within the recesses to form embedded silicon regions. Source and drain regions then can be formed in the embedded silicon regions. The difference between the lattice constant of silicon and that of the underlying first and second regions results in tensile stressed silicon over the first semiconductor region and compressive stressed silicon over the second semiconductor region.

10 Claims, 3 Drawing Sheets

COMPLEMENTARY FIELD EFFECT TRANSISTORS HAVING EMBEDDED SILICON SOURCE AND DRAIN REGIONS

BACKGROUND OF THE INVENTION

1. Technical Field

The present invention relates to semiconductor devices and their fabrication.

2. Description of Related Art

Strained silicon p-type field effect transistors have been described which include a transistor channel in a region consisting essentially of silicon and source and drain regions which include embedded regions of silicon germanium at opposite (front and rear) ends of the transistor channel for applying a compressive stress to the silicon transistor channel region. Typically, the embedded silicon germanium regions are formed by epitaxial growth from a surface of an underlying silicon region. Similarly, n-type field effect transistors have been described which include a silicon transistor channel and embedded regions of silicon carbon at opposite front and rear ends of the transistor channel for applying a tensile stress to the transistor channel. However, silicon carbon regions are difficult to grow epitaxially without defect. In addition, difficulties are presented in integrating epitaxy processes for both silicon germanium and silicon carbon in one process for fabricating PFETs and NFETs on a substrate.

It would be desirable to provide a process for forming both PFETs and NFETs with channels provided in regions of strained semiconductor material.

SUMMARY OF THE INVENTION

In accordance with an aspect of the invention, a method is provided for fabricating complementary stressed semiconductor devices: e.g., an NFET having a tensile stressed channel and a PFET having a compressive stressed channel. In such method, a first semiconductor region having a lattice constant larger than silicon can be epitaxially grown on an underlying semiconductor region of a substrate. The first semiconductor region can be grown laterally adjacent to a second semiconductor region which has a lattice constant smaller than that of silicon. Layers consisting essentially of silicon can be grown epitaxially onto exposed major surfaces of the first and second semiconductor regions after which gates can be formed which overlie the epitaxially grown silicon layers. Portions of the first and second semiconductor regions adjacent to the gates can be removed to form recesses. Regions consisting essentially of silicon can be grown within the recesses to form embedded silicon regions. Source and drain regions then can be formed in the embedded silicon regions. The difference between the lattice constant of silicon and that of the underlying first and second regions results in tensile stressed silicon over the first semiconductor region and compressive stressed silicon over the second semiconductor region.

In accordance with another aspect of the invention, semiconductor devices are provided which may include a first semiconductor region grown epitaxially on an underlying semiconductor region of a substrate, in which the first semiconductor region can have a lattice constant larger than that of silicon. The first semiconductor region may be laterally adjacent to a second semiconductor region of the substrate, and the second semiconductor region may have a lattice constant smaller than that of silicon. Layers consisting essentially of silicon may be epitaxially grown onto exposed major surfaces of the first and second semiconductor regions. A first gate may overlie the first semiconductor region and a second gate may overlie the second semiconductor region. Regions consisting essentially of single-crystal silicon may be epitaxially grown within recesses extending from the gates downwardly into the first and second semiconductor regions of the substrate. The recesses may be laterally adjacent to the gates. Source and drain regions of the devices may extend at least partially in the silicon regions grown epitaxially within the recesses laterally adjacent to the first and second gates. In an embodiment, the foregoing elements can form an n-type field effect transistor ("NFET") having a tensile stressed channel in the silicon region overlying the first semiconductor region and can form a p-type field effect transistor ("PFET") having a compressive stressed channel in the silicon region overlying the second semiconductor region.

DETAILED DESCRIPTION

In accordance with an embodiment of the invention described herein, a process is provided for forming both PFETs and NFETs in which the channel of each is provided in a region of strained semiconductor material. In accordance with such embodiment, the transistors can be formed without requiring silicon carbon to be grown within an etched recess by epitaxy. Instead, in such embodiment, silicon channel regions can be disposed overlying relaxed semiconductor alloy regions to apply a beneficial stress to the channel regions. Regions consisting essentially of silicon can also be grown epitaxially in recesses adjacent to gates of the transistors into which source and drain regions then will be formed.

Figure 1:
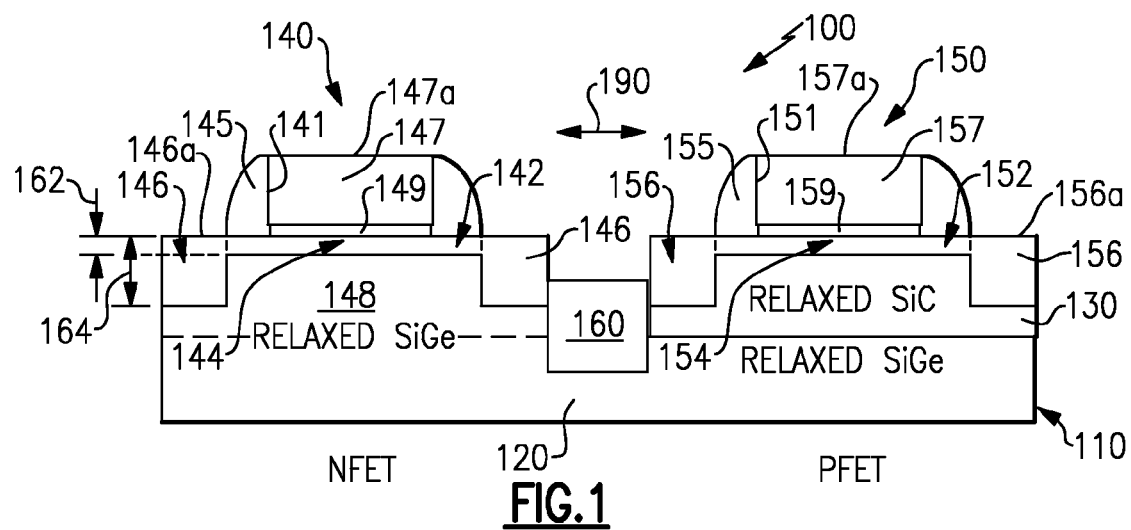
FIG. 1 is a sectional view illustrating a pair of complementary field effect transistors in accordance with an embodiment of the invention.

Thus, for example, as illustrated in FIG. 1, in accordance with an embodiment of the invention herein, a pair of complementary field effect transistors, i.e., an n-type field effect transistor ("NFET") 140 and a p-type field effect transistor ("PFET") 150 are provided in a hybrid semiconductor alloy substrate 110. As used in this connection, the term "hybrid" refers to a semiconductor substrate in which one semiconductor alloy region 148 has a lattice constant larger than that of silicon, and another semiconductor alloy region 130 laterally adjacent thereto has a lattice constant smaller than that of silicon. The region 148 having the larger lattice constant may consist essentially of silicon germanium, for example. The region 130 having the smaller lattice constant may consist essentially of silicon carbon, for example. As described in further detail below, these differences in lattice constant cause silicon regions contacting the regions 148 and 130 to acquire compressive and tensile stresses. The NFET 140 has tensile stressed regions 146 and a tensile stressed channel 144 in a region 142. These regions 142, 146 consist essentially of silicon and overlie region 148. The PFET 150 has compressive stressed regions 156 and a compressive stressed channel 154 in a region 152, these regions 152, 156 consisting essentially of silicon overlying the region 130. For electrical isolation, a trench isolation region 160 may be disposed between the NFET 140 and the PFET 150 in the lateral direction 190.

When region 148 includes silicon germanium, an exemplary concentration of germanium is between 20% and 100%. Thus, the region 148 can consist essentially of germanium (i.e., have a concentration of germanium at essentially 100%), or an alloy of silicon with germanium in which the relative concentration of germanium in the alloy is between 20% and 100%, where the remaining content of the alloy is silicon. When the region 130 includes silicon carbon, an exemplary concentration of carbon in the alloy is between 1% and 10%, with the remaining content of the alloy typically being silicon. Regions 142, 152 consisting essentially of silicon adjacent to the gate dielectric layers 149, 159 should not be very thick. An exemplary thickness 162 of such regions in a direction normal to the gate dielectric is from five to ten nanometers (nm). The concentration of germanium or carbon in the respective regions 148, 130 may be limited in relation to the thickness 162 of the essentially silicon regions 142, 152 of the transistors, such that selecting a greater or smaller concentration of germanium or carbon for regions 148, 130 may require a reduction in the thickness of the regions 142,152.

A feature of the NFET and the PFET are that each includes respective regions 146 or 156 which consist essentially of silicon epitaxially grown within recesses adjacent to the gates. An exemplary thickness 164 of the regions 146, 156 in a direction normal to the major surface of the gate dielectric is from 50 nanometers to 150 nanometers (nm). The source and drain regions of the NFET extend from an exposed surface of the substrate adjacent to the gates downwardly into the essentially silicon regions 146 to a depth at least partially into region 148 underlying the silicon region 144. In a similar manner, the source and drain regions of the PFET extend from an exposed surface of the substrate adjacent to the gates downwardly into the silicon region 156 to a depth at least partially into region 130.

Referring to FIG. 1, semiconductor region 148 may be grown epitaxially on a surface of an underlying semiconductor region 120 which also underlies region 130. The epitaxially grown region 148 is adjacent to another semiconductor region 130 in a lateral direction 190. These two semiconductor regions 130, 148 may be separated from each other in the lateral direction 190 by isolation region 160. Each of the NFET and the PFET has a gate 147, 157, respectively, which is separated from the epitaxially grown silicon region by a gate dielectric 149, 159, respectively. Dielectric spacers 145, 155, respectively, typically are disposed along walls 141, 151 of the gates. Although not specifically shown in FIG. 1, the gates 147, 157 and the source and drain regions 146, 156 can have layers of conductive silicides (not shown) contacting exposed surfaces 146a, 156a of the source and drain regions 146, 156 and exposed surfaces 147a, 157a of the gates 147, 157. Alternatively, low-resistance layers (not shown) including a metal, a compound of a metal or both can extend along exposed surfaces 146a, 156a of the source and drain regions 146, 156 and exposed surfaces 147a, 157a of the gates 147, 157.

Figure 2:
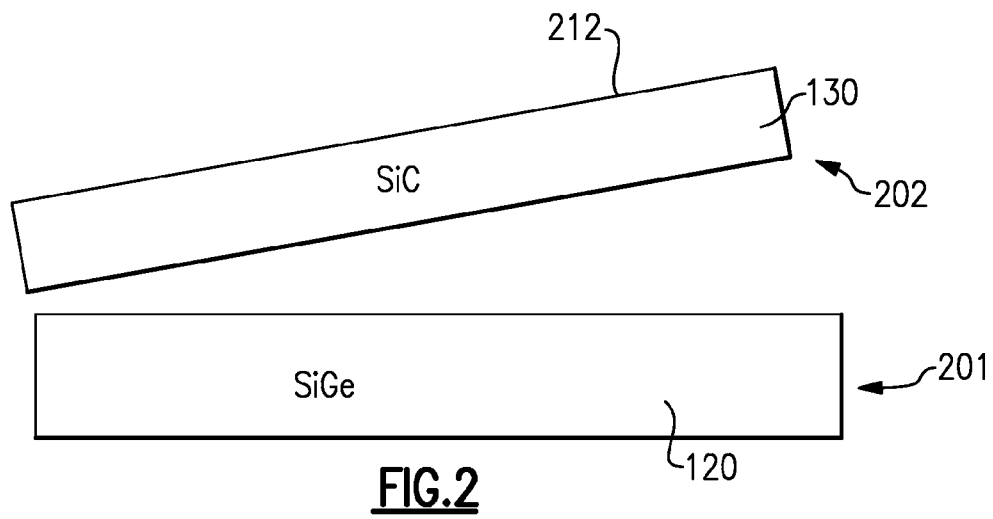
FIGS. 2 through 10 are sectional views illustrating stages in a method of fabricating complementary field effect transistors in accordance with an embodiment of the invention.

A method of manufacturing the complementary transistor structure 100 will now be described with reference to FIG. 2. As shown therein, a first substrate 201 having an exposed region 120 of a semiconductor alloy of silicon with germanium is bonded with a second substrate 202 having an exposed region of a semiconductor alloy of silicon with carbon 130. Each of the substrates may be an entire semiconductor wafer or a portion thereof. In one embodiment, the first substrate may consist essentially of silicon germanium and the second substrate may consist essentially of silicon carbon. Alternatively, the first substrate may include one or more regions underlying the exposed region of silicon germanium alloy and the second substrate and the second substrate may include one or more regions underlying the exposed region of silicon carbon alloy. After bonding the first and second substrates, the thickness of the second substrate may be reduced, such that the thickness 230 (FIG. 3) of the silicon carbon region 130 above the underlying silicon germanium is within desirable limits. For example, the thickness may be reduced after bonding the two substrates by grinding the rear surface 212 of the second substrate or by cleaving the second substrate, such as by a SMART cut process, so as to separate a relatively thick layer 130 from another portion of the second substrate which can then be reused.

Figure 3:
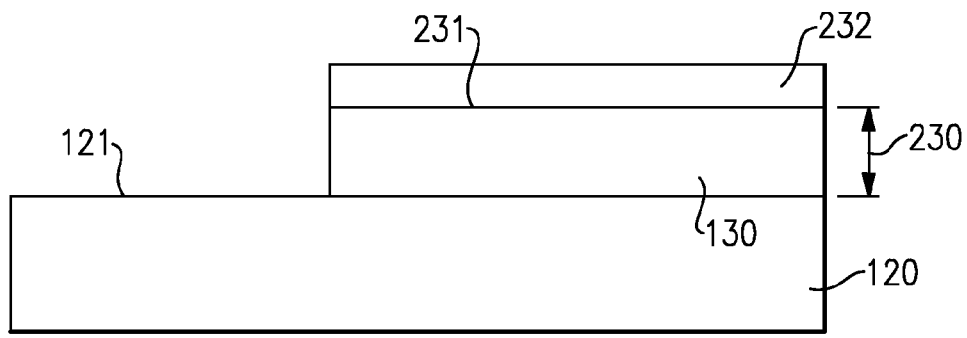

As further shown in FIG. 3, a portion of the silicon carbon region 130 then is removed, thereby exposing a major surface 121 of the underlying silicon germanium region 120. Illustratively, a hard mask layer 232 can be formed and patterned to cover a portion of the silicon carbon region 130 to remain and exposing another portion for removal. Then, a process such as a reactive ion etch ("RIE") can be used to remove the unwanted portion, thereby exposing the major surface 121 of the underlying silicon germanium region.

Figure 4:
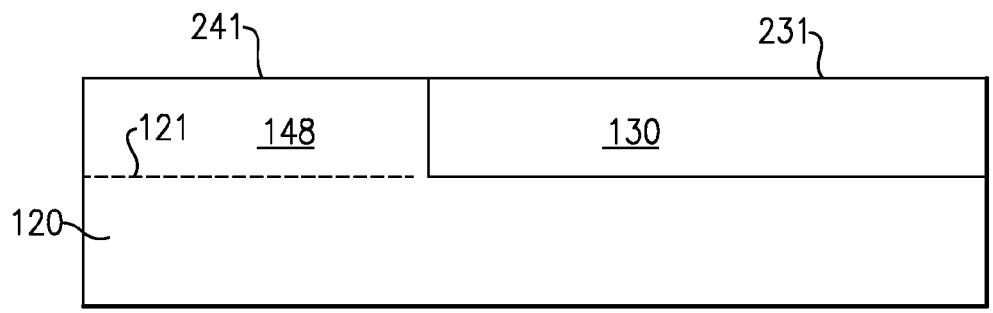

Subsequently, as illustrated in FIG. 4, a region 148 consisting essentially or germanium or silicon germanium 148 is epitaxially grown from the exposed surface 121 of the underlying semiconductor region 120. The epitaxial region 148 can be grown selectively on the underlying semiconductor region 130 while the hard mask layer 232 (FIG. 3) remains in place covering the major surface 231 of the silicon carbon region. Thereafter, the hard mask layer 232 is removed from the silicon carbon region. In a particular embodiment, a process such as chemical mechanical polishing ("CMP") can be used to remove the hard mask layer 232 while also helping to planarize the exposed surface 241 of the resulting epitaxial region 148 with the exposed surface 231 of the silicon carbon region 130.

The epitaxial region 148 has a germanium concentration as required by the above-stated constraints, i.e., between about 20% and 100% germanium and a concentration of silicon making up the remainder. The region 148 can have the same concentration or a different concentration of germanium from that of the underlying semiconductor region 120. The fully formed epitaxial region 148 is disposed laterally adjacent to the silicon carbon region 130.

Figure 5:
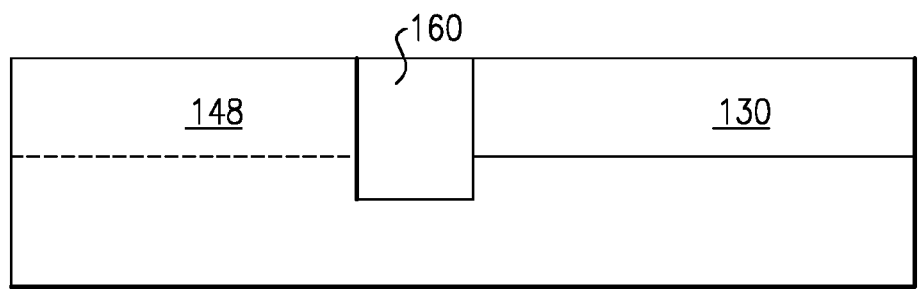

Thereafter, as illustrated in FIG. 5, steps are performed to form a trench isolation region 160 which separates the epitaxial region 148 from the silicon carbon region 130 in the lateral direction. The trench isolation region 160 can be formed by etching a trench in the substrate through an opening in a mask (not shown) overlying the major surfaces 231, 241 (FIG. 4) and filling the trench with a dielectric material which may include an oxide or other material. Typically, the mask is a hard mask, such as may include a pad nitride layer, pad oxide layer, or both, disposed above the major surfaces 231, 241.

Figure 6:
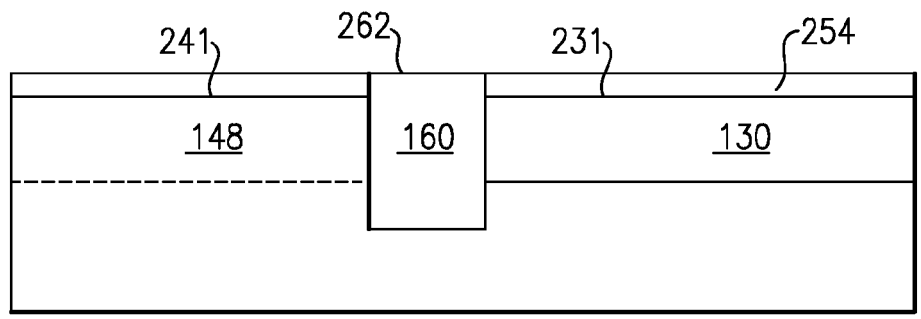

Subsequently, as illustrated in FIG. 6, a single-crystal semiconductor layer 254 consisting essentially of silicon is grown epitaxially onto the exposed surfaces 231, 241 of the semiconductor regions 130, 148. The single-crystal layer 254 can be grown selectively onto the exposed semiconductor regions such that semiconductor material is not deposited onto an exposed surface 262 of the trench isolation region 160.

Figure 7:
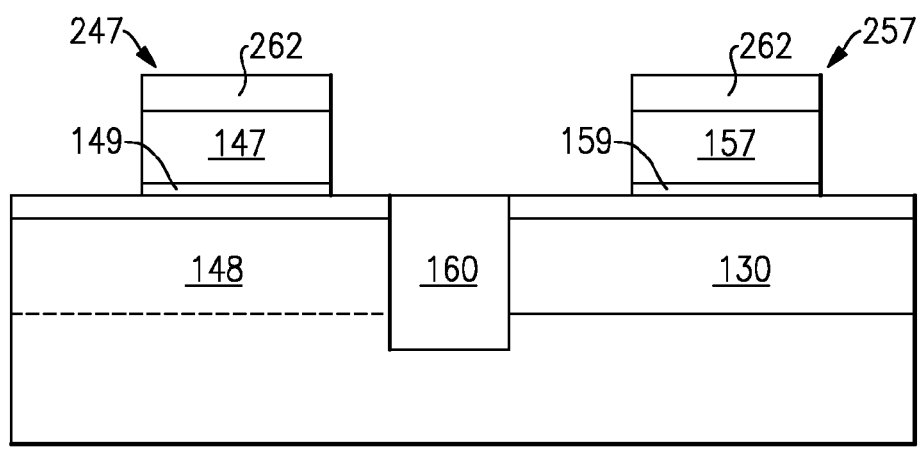

FIG. 7 illustrates a subsequent stage of fabrication after gate stacks 247, 257 have been patterned overlying each of the respective regions 148, 130. As illustrated, at this stage of fabrication, each gate stack includes a gate dielectric 149 or 159, a gate 147 or 247 and a hard mask layer 262. The hard mask layer typically includes silicon nitride or other suitable material remaining from a process used to pattern the hard mask.

Figure 8:
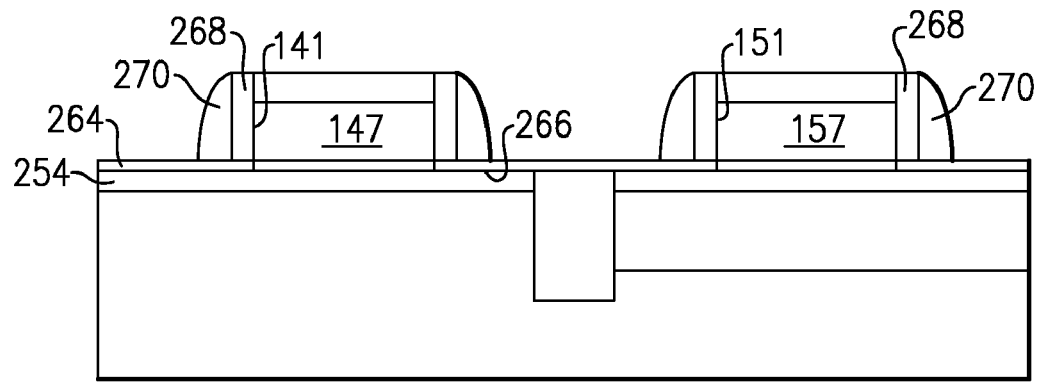

In a subsequent stage of fabrication illustrated in FIG. 8, a pad dielectric layer 264, e.g., a pad oxide, is formed to overlie an exposed major surface 266 of the epitaxial silicon layer 254. A set of dielectric spacers 268, 270 are formed on exposed walls 141, 151 of each of the gates 147, 157. In one illustrative embodiment, the spacers 268 can be formed by local oxidation of the gate semiconductor material present at the walls 141, 151 of the gates 147, 157. Thereafter, spacers 270 can be formed by conformally depositing a layer of dielectric material such as an oxide or nitride, for example, and then etching the deposited dielectric material in a vertical direction, i.e., a direction normal to the major surface 266, such as by RIE.

Figure 9:
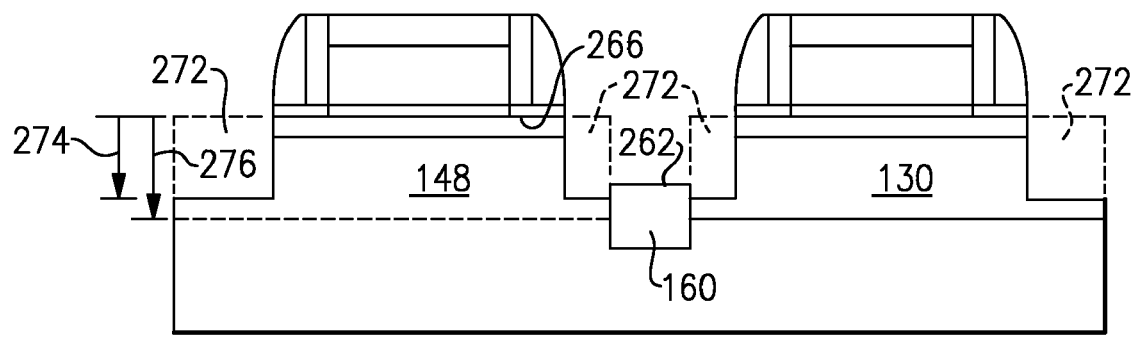

Thereafter, the silicon region 254 and the regions 148, 130 (FIG. 9) underlying them are simultaneously vertically etched to define recesses 272 which extend to a depth 274 well below the major surface 266 of the silicon region 254. The exposed major surface of the trench isolation region 160 may also be recessed somewhat during the process, as depicted in FIG. 9. In the embodiment shown in FIG. 9, the depth 274 of the recesses 272 is above the maximum depth 276 of the semiconductor regions 148, 130. As apparent from FIGS. 8 and 9, the recesses 272 adjacent to each of the gate 147 and the gate 157 can be formed simultaneously by one etch process performed in a manner self-aligned to the gates 147, 157.

Figure 10:
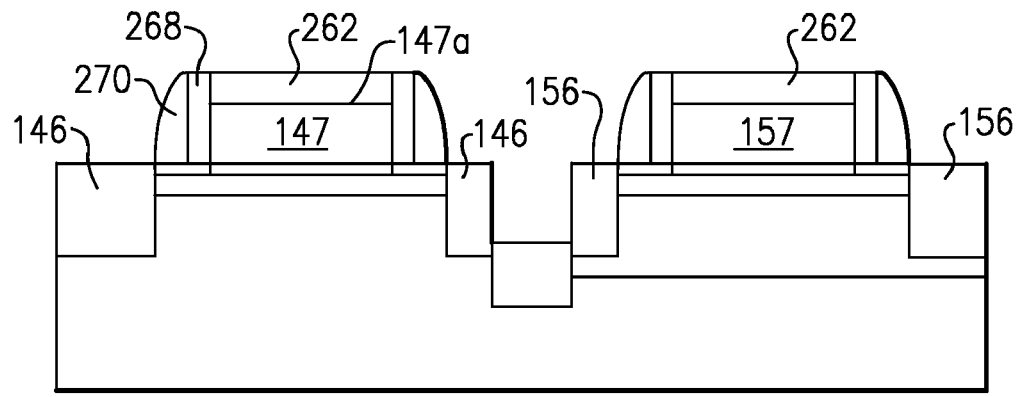

Thereafter, regions 146, 156 consisting essentially of silicon are now grown epitaxially within the recesses 272 (FIG. 9), resulting in the structure as illustrated in FIG. 10. Subsequently, a mask (not shown) can be patterned to cover the active semiconductor region including epitaxial regions 156 and the gate 157 while exposing the active semiconductor region which includes epitaxial regions 146 and gate 147. Because of the larger lattice constant of underlying semiconductor region 148, regions 146 become tensile stressed. Conversely, because of the smaller lattice constant of underlying semiconductor region 130, regions 156 become compressive stressed.

Thereafter, spacers 268, 270 can be removed from walls of the gate 147 and ion implantation steps can be performed to establish gate doping and to form the source and drain regions which extend at least partially into the epitaxial silicon regions 146. That mask can be removed and this process can then be repeated by forming another mask (not shown) which covers gate 147 while exposing gate 157 and then performing ion implantation to the gate 157 and active semiconductor regions 156 to define the gate doping and source and drain regions of a PFET.

Thereafter, final spacers 145 (FIG. 1) can be formed along walls of the gates 147 and 157, followed by removal of the mask layer 262 from the gates 147, 157 and formation of low-resistance layers (not shown), e.g., silicide layers along exposed surfaces 146a, 147a, 156a and 157a of the source and drain regions and the gates, resulting in the arrangement including an NFET 140 and a PFET 150 as illustrated in FIG. 1.

While the invention has been described in accordance with certain preferred embodiments thereof, many modifications and enhancements can be made thereto without departing from the true scope and spirit of the invention, which is limited only by the claims appended below.

What is claimed is:

1. Semiconductor devices, comprising:
   (a) a first semiconductor region on an underlying semiconductor region of a substrate, the first semiconductor region having a lattice constant larger than that of silicon and being laterally adjacent to a second semiconductor region of the substrate, the second semiconductor region having a lattice constant smaller than that of silicon;
   (b) layers consisting essentially of silicon epitaxially grown onto exposed major surfaces of the first and second semiconductor regions;
   (c) a first gate overlying the first semiconductor region and a second gate overlying the second semiconductor region;
   (d) regions consisting essentially of single-crystal silicon epitaxially grown within recesses extending from the gates downwardly into the first and second semiconductor regions of the substrate, the recesses being laterally adjacent to the gates; and
   (e) source and drain regions extending at least partially in the silicon regions grown epitaxially within the recesses laterally adjacent to the first and second gates,
   wherein elements (a) through (e) form an n-type field effect transistor ("NFET") having a tensil stressed channel in the silicon region overlying the first semiconductor region and a p-type field effect transistor ("PFET") having a compressive stressed channel in the silicon region overlying the second semiconductor region.

2. Semiconductor devices as claimed in claim 1, wherein the first semiconductor region includes silicon germanium and the second semiconductor region includes silicon carbon.

3. Semiconductor devices as claimed in claim 1, wherein the first semiconductor region includes silicon germanium.

4. Semiconductor devices as claimed in claim 1, wherein the second semiconductor region includes silicon carbon.

5. Semiconductor devices as claimed in claim 1, wherein the underlying semiconductor region consists essentially of silicon germanium.

6. Semiconductor devices as claimed in claim 1, wherein the thickness of the single-crystal silicon layer contacting the gate dielectric layer is much less than the thickness of the single-crystal silicon regions in which the source and drain regions at least partially extend.

7. Semiconductor devices as claimed in claim 1, wherein the thickness of the single-crystal silicon layer contacting the gate dielectric layer is between about 5 nanometers and about 10 nanometers.

8. Semiconductor devices as claimed in claim 7, wherein the thickness of the single-crystal silicon regions in which the source and drain regions at least partially extend is between about 50 nanometers and about 150 nanometers.

9. Semiconductor devices as claimed in claim 1, wherein the single-crystal silicon regions of the NFET in which the source and drain regions are disposed have bottom surfaces remote from the top surfaces adjacent to the gate and the first semiconductor region contacts the bottom surfaces of those single-crystal silicon regions.

10. Semiconductor devices as claimed in claim 1, wherein the single-crystal silicon regions of the PFET in which the source and drain regions are disposed have bottom surfaces remote from the top surfaces adjacent to the gate and the second semiconductor region contacts the bottom surfaces of those single-crystal silicon regions.

* * * * *